United States Patent [19]
Hanawa et al.

[11] Patent Number: 5,548,827
[45] Date of Patent: Aug. 20, 1996

[54] PORTABLE RADIO COMMUNICATION DEVICE CAPABLE OF TRANSMITTING THE SAME LEVEL OF ELECTRICAL ENERGY WHEN THE ANTENNA IS STORED OR EXTENDED

[75] Inventors: Tetsuya Hanawa; Yuji Kuga; Yutaka Takashima; Yoshihiro Matsumoto; Masayuki Ono, all of Kawasaki, Japan

[73] Assignee: Fujitsu Limited, Kawasaki, Japan

[21] Appl. No.: 196,461

[22] Filed: Feb. 15, 1994

[30] Foreign Application Priority Data

Sep. 16, 1993 [JP] Japan .................................... 5-229818

[51] Int. Cl.⁶ ............................................. H04B 1/04
[52] U.S. Cl. ........................ 455/129; 455/126; 455/127; 343/752; 343/895; 343/702
[58] Field of Search ................................ 343/752, 895, 343/702; 455/129, 127, 126, 193.1, 193.2, 193.3, 290, 291, 107, 121, 277.1; H01Q 1/24, 9/32, 1/36, 11/08

[56] References Cited

U.S. PATENT DOCUMENTS

| | | | |
|---|---|---|---|
| 4,335,469 | 1/1982 | Tharp et al. | 455/125 |
| 4,868,576 | 9/1989 | Johnson, Jr. | 343/702 |
| 4,882,591 | 11/1989 | Galvin et al. | 343/715 |
| 5,144,324 | 9/1992 | Chin et al. | 455/127 X |
| 5,353,036 | 10/1994 | Baldry | 343/702 |
| 5,374,937 | 12/1994 | Tsunekawa et al. | 343/702 |

FOREIGN PATENT DOCUMENTS

| | | |
|---|---|---|
| 392079 | 10/1990 | European Pat. Off. . |
| 511577 | 11/1992 | European Pat. Off. . |
| 522806 | 1/1993 | European Pat. Off. . |
| 2219911 | 12/1989 | United Kingdom . |
| 2235588 | 6/1991 | United Kingdom . |

OTHER PUBLICATIONS

Motorola Technical Developments, vol. 19, Jun. 1993, US Wiggenhorn, "Hel/Tel Antenna".

*Primary Examiner*—Reinhard J. Eisenzopf
*Assistant Examiner*—Philip J. Sobutka
*Attorney, Agent, or Firm*—Staas & Halsey

[57] ABSTRACT

A portable radio communication device has an antenna which can be extended for use and retracted for storage, and can transmit a signal at the same level of electric energy when the antenna is stored as when the antenna is extended. When the antenna is retracted and stored, the stored condition is detected by a detecting switch. In response to a detected signal from the detecting switch, a transmission output controller produces an increased transmission output control signal to increase the level of electric energy of the signal to be transmitted which is higher than a normal level of electric energy of signals transmitted from the antenna. When the increased transmission output control signal is generated, a power amplifier amplifies a signal to be transmitted which is supplied from a transmission signal generator, and supplies the amplified signal to the antenna. Therefore, even when the antenna is stored, it can radiate the signal at the same level of electric energy as when the antenna is extended. The antenna comprises an antenna which operates as a loaded antenna when it is extended and as a helical antenna when it is stored.

15 Claims, 13 Drawing Sheets

PORTABLE RADIO COMMUNICATION DEVICE CAPABLE OF TRANSMITTING THE SAME LEVEL OF ELECTRICAL ENERGY WHEN THE ANTENNA IS STORED OR EXTENDED

BACKGROUND OF THE INVENTION

1. Field of the Invention

The present invention relates to a portable radio communication device, and more particularly to a portable radio communication device with an antenna that is extendable for use and retractable for storage, and a loaded antenna for use on a portable radio communication device.

2. Description of the Related Art

Recent years have seen widespread use of portable radio communication devices such as portable telephone sets. Such portable radio communication devices are required to be small in size and light in weight, and have antennas that are extended when in use and stored when not in use.

On small-size portable radio communication devices, the antenna is positioned closely to those components, including the housing of the device and the printed-circuit board in the housing, which affect the characteristics of the antenna. When the antenna is stored, it is positioned in the housing close to the printed-circuit board, resulting in a reduced antenna gain. During storage of the antenna, the gain of the antenna is also lowered because the effective length of the antenna is smaller.

To meet the requirements for small sizes and low weights, there have been demands for portable telephone sets, cordless telephone sets, and low-power radio communication devices which have smaller and lighter circuit components and batteries, and smaller and higher-performance antennas.

Generally, portable radio communication devices are designed to radiate a predetermined amount of electrical energy while the antenna is being extended.

The user of a portable telephone set extends its antenna before making an outgoing call through the portable telephone set. However, when an incoming call from another party arrives, the antenna has usually been stored in the housing of the portable telephone set. Upon arrival of the call, the user extends the antenna for use.

More specifically, when a portable telephone set receives an incoming call from a central office, it is necessary for the portable telephone set to transmit a response signal to the central office in response to the incoming call for the purpose of confirming a telephone connection that has been established between the central office and the portable telephone set, so that a ringing tone can be generated indicating the incoming call to the user.

When the antenna of the portable telephone set is stored at the time the incoming call arrives, however, since the gain of the antenna is lowered, the electric energy radiated from the antenna is at a low level. If the portable telephone set is distant from the central office, then the response signal which is transmitted from the portable telephone set in response to the incoming call may not reach the central office, and the portable telephone set may not generate a ringing tone. Therefore, since the characteristics of the storable antennas are degraded when the antennas are in storage, it has been desired to mechanically improve the characteristics of the storable antennas.

Heretofore, most portable telephone sets employ whip antennas. Attempts to make portable telephone sets smaller in size have also resulted in the use of planar antennas, top-loaded antennas, small-sized whip antennas, and bottom-loaded antennas.

The bottom-loaded antennas have find use as fixed antennas, but have not been used as antennas that can be retracted or contracted for storage.

SUMMARY OF THE INVENTION

It is therefore an object of the present invention to provide a portable radio communication device which is capable of transmitting the same level of electrical energy when the antenna is stored as when the antenna is extended.

Another object of the present invention is to provide a loaded antenna for use on a portable radio communication device, the loaded antenna being capable of transmitting the same level of electrical energy when its antenna is stored as when the antenna is extended.

Still another object of the present invention is to provide a bottom-loaded antenna for use on a portable radio communication device, the bottom-loaded antenna being operable as a loaded whip antenna when extended and as a helical antenna when stored.

Yet still another object of the present invention is to provide a loaded antenna for use on a portable radio communication device, the loaded antenna being mechanically switchable to different loading coils when the antenna is extended and stored.

According to the present invention, there is provided a portable radio communication device having an antenna which can be extended for use and retracted for storage, comprising a detector for detecting a condition in which the antenna is stored, and producing a stored condition signal representing the detected condition, transmission signal generator for generating a signal to be transmitted through the antenna, transmission output controller responsive to the stored condition signal from the detector for producing an increased transmission output control signal to increase the level of electric energy of the signal to be transmitted through the antenna when the antenna is stored, and a power amplifier responsive to the increased transmission output control signal from the transmission output controller, for amplifying the signal generated by the transmission signal generator and supplying the amplified signal to the antenna.

When the antenna is retracted and stored, the stored condition is detected by the detecting means. In response to a stored condition signal from the detector, the transmission output controller produces an increased transmission output control signal to increase the level of electric energy of the signal to be transmitted which is higher than a normal level of electric energy of signals transmitted from the antenna. When the increased transmission output control signal is generated, the power amplifier amplifies a signal to be transmitted which is supplied from the transmission signal generator and supplies the amplified signal to the antenna. Therefore, even when the antenna is stored, it can radiate the signal at the same level of electric energy as when the antenna is extended.

According to the present invention, there is also provided a loaded antenna which can be extended for use and retracted for storage, for use on a portable radio communication device, comprising a feeding point member for supplying a signal to be transmitted, a loading coil having one end electrically connected to the feeding point member, and a whip antenna disposed for movement between an extended position in which the whip antenna is electrically connected to the other end of the loading coil, and a stored position in which the whip antenna is electrically disconnected from the other end of the loading coil.

When the whip antenna is extended, it operates as a bottom-loaded antenna. When the whip antenna is extended, it operates as a helical antenna.

According to the present invention, there is further provided a loaded antenna which can be extended for use and retracted for storage, for use on a portable radio communication device, comprising a feeding point member for supplying a signal to be transmitted, a bottom loading coil having one end electrically connected to the feeding point member, a whip antenna disposed for movement between an extended position in which one end of the whip antenna is electrically connected to the other end of the bottom loading coil, and a stored position in which the one end of the whip antenna is electrically disconnected from the other end of the bottom loading coil, and a top loading coil electrically connected to the other end of the whip antenna, the top loading coil being disposed for electrical connection to the other end of the bottom loading coil when the whip antenna is in the stored position and electrical disconnection from the other end of the bottom loading coil when the whip antenna is in the extended position.

When the whip antenna is extended, it operates as a loaded antenna with the top and bottom loading coils. When the whip antenna is extended, it operates as a helical antenna.

According to the present invention, there is also provided a loaded antenna which can be extended for use and retracted for storage, for use on a portable radio communication device, comprising a feeding point member for supplying a signal to be transmitted, a whip antenna disposed for movement between an extended position in which the whip antenna is electrically connected to the feeding point member, and a stored position, an extension loading coil electrically connected to the whip antenna, and a storage loading coil disposed for electrical connection to the feeding point member when the whip antenna is in the stored position.

When the whip antenna is extended, it operates as a top-loaded antenna. When the whip antenna is extended, it operates as a helical antenna.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
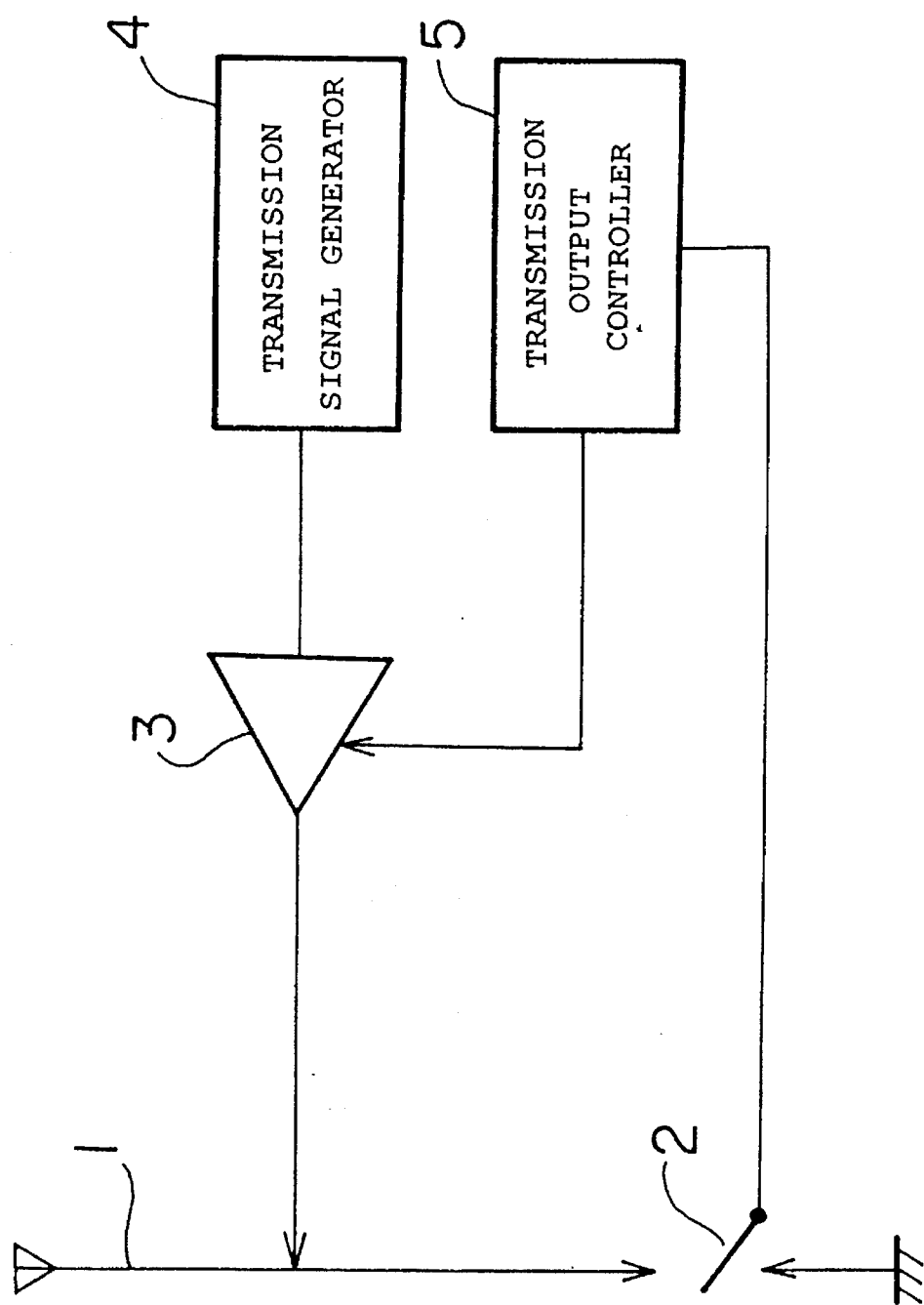
FIG. 1 is a block diagram showing the principles of a portable radio communication device according to the present invention.

FIG. 1 shows the principles of a portable radio communication device according to the present invention. As shown in FIG. 1, the portable radio communication device comprises an antenna 1 that can be extended for use and retracted or contracted for storage, a detecting switch 2 for detecting when the antenna 1 is stored, a transmission signal generator 4 for generating a signal to be transmitted from the antenna 1, a transmission output controller 5 for producing an increased transmission output control signal to increase the level of electric energy of the signal to be transmitted which is higher than a normal level of electric energy of signals transmitted from the antenna 1, in response to a detected signal, i.e., a stored condition signal, from the detecting switch 2, and a power amplifier 3 for amplifying the signal from the transmission signal generator 4 to the higher level of electric energy in response to the increased transmission output control signal from the transmission output controller 5 and sending the amplified signal to the antenna 1 for transmission therefrom.

When the antenna 1 is retracted and stored, the stored condition is detected by the detecting switch 2. When the transmission output controller 5 recognizes that the antenna 1 is stored based on the detected signal from the detecting switch 2, the transmission output controller 5 produces an increased transmission output control signal. In response to the increased transmission output control signal, the power amplifier 3 amplifies the signal from the transmission signal generator 4 and sends the amplified signal to the stored antenna 1, which thus transmits the amplified signal at the same level of electric energy as when the antenna 1 is extended.

Figure 2:
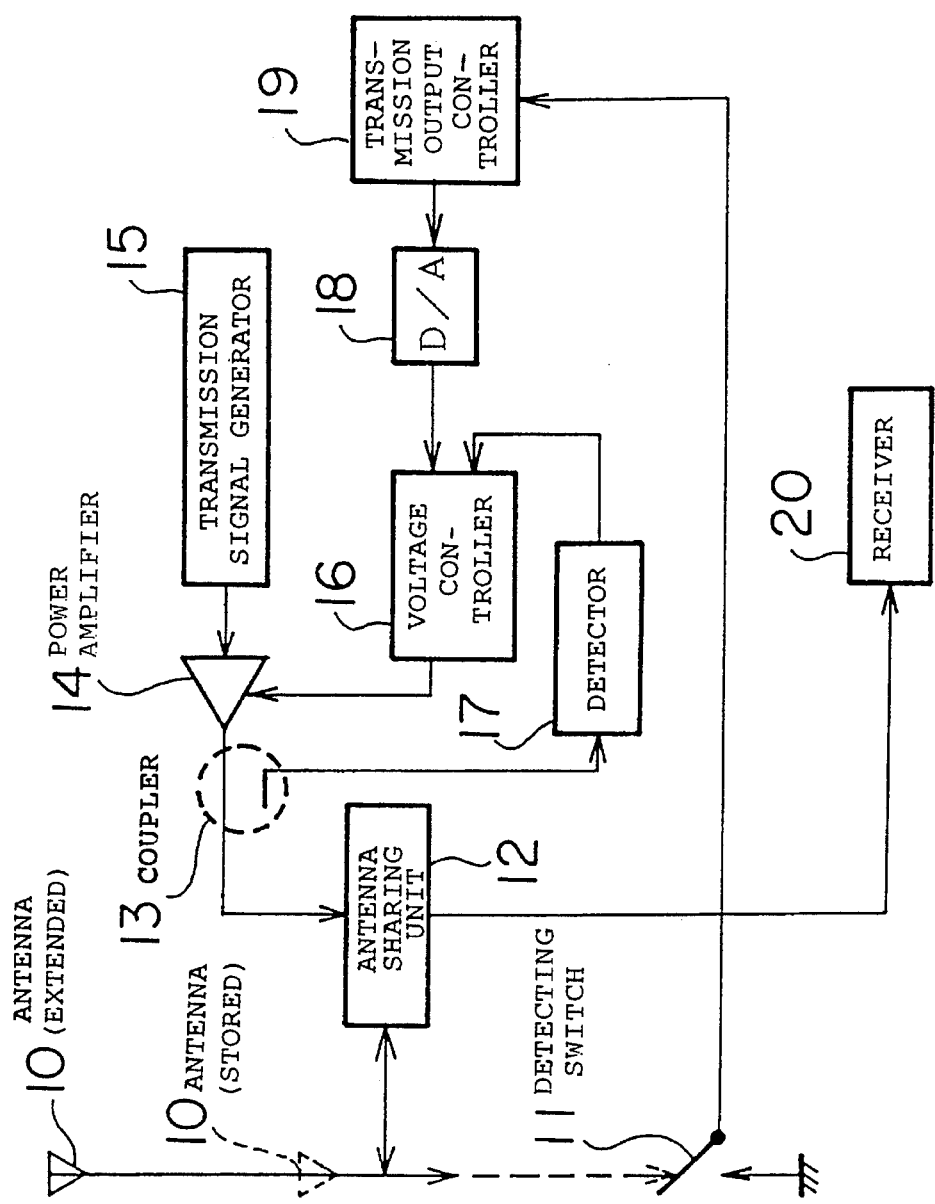
FIG. 2 is a block diagram of a hardware arrangement of a portable radio communication device according to the present invention.

FIG. 2 shows, in specific block form, a hardware arrangement of a portable radio communication device according to the present invention. The portable radio communication device has an antenna 10 that can be extended for use as indicated by the solid line and retracted for storage as indicated by the broken line. When the antenna 10 is stored, the stored condition of the antenna 10 is detected by a detecting switch 11, which supplies a detected signal, i.e., a stored condition signal, to a transmission output controller 19. Based on the detected signal supplied from the detecting switch 11, the transmission output controller 19 recognizes that the antenna 10 is stored, and produces a digital increased transmission output control signal to increase the level of electric energy which is to be transmitted from the stored antenna 10, as described in detail later on.

The digital increased transmission output control signal is sent from the transmission output controller 19 to a digital-to-analog (D/A) converter 18, and converted thereby into an analog signal which is applied to a voltage controller 16. The voltage controller 16 compares the analog increased transmission output control signal with an output signal fed back from a detector 17, and supplies an amplification command signal to a power amplifier 14 so that the output signal fed back from the detector 17 agrees with the analog increased transmission output control signal. The power amplifier 14 amplifies a signal to be transmitted which is generated by a transmission signal generator 15, according to the amplification command signal from the voltage controller 16. The amplified signal outputted from the power amplifier 14 is supplied through an antenna sharing unit 12 to the antenna 10, and then radiated by the antenna 10.

The amplified signal outputted from the power amplifier 14 is also sent through a coupler 13 to the detector 17. The detector 17 detects the amplified signal outputted from the power amplifier 14 and supplies the detected signal as a DC output feedback signal to the voltage controller 16. A signal that is received by the antenna 10 is supplied through the antenna sharing unit 12 to a receiver 20.

As described above, when the antenna 10 is stored, the transmission output controller 19 outputs an increased transmission output control signal to enable the power amplifier 14 to amplify the signal to be transmitted to the same level of electric energy as when the antenna 10 is extended.

Figure 3:
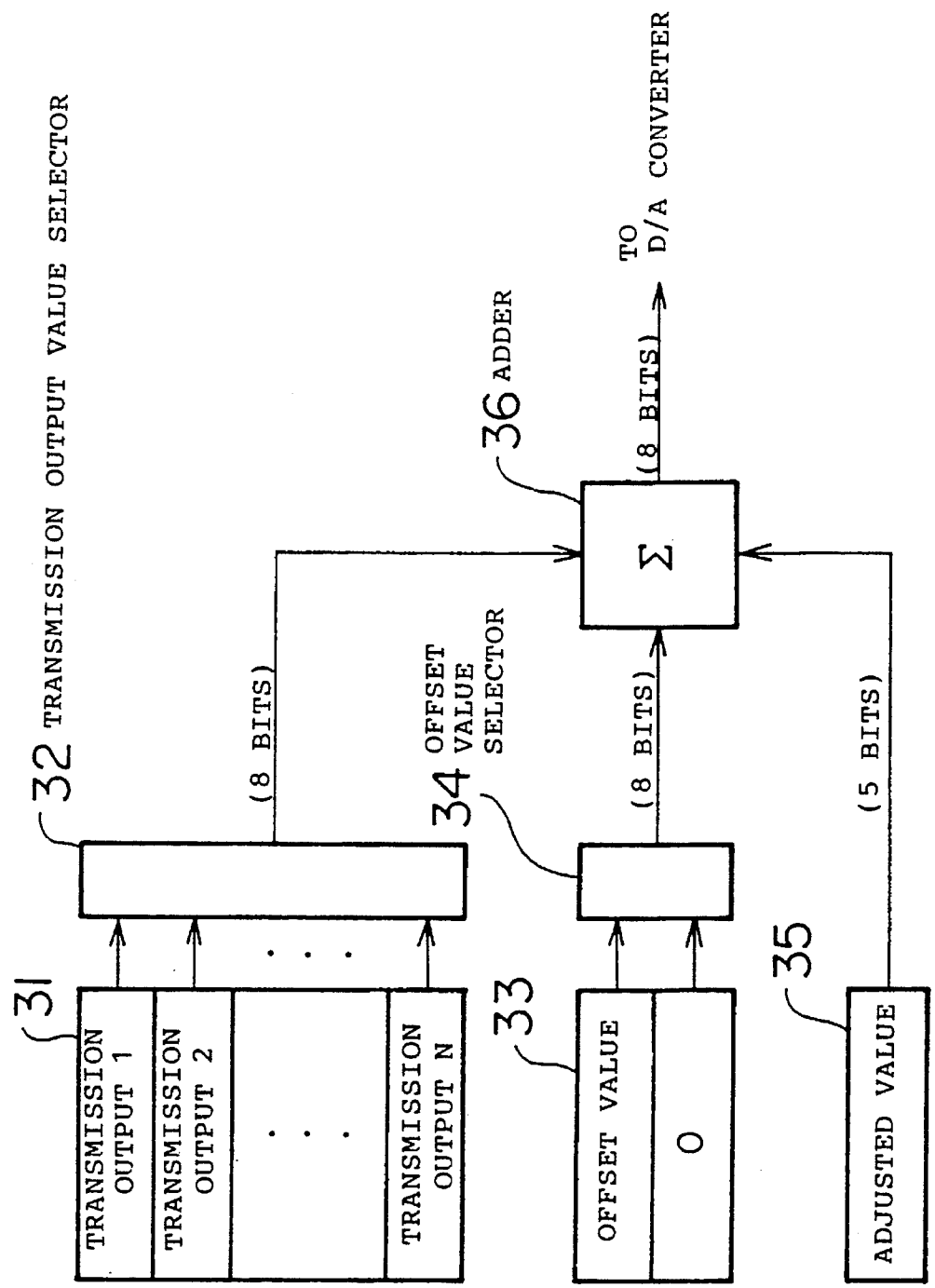
FIG. 3 is a block diagram of a transmission output controller according to the present invention.

The transmission output controller 19 will be described in detail below. FIG. 3 shows a transmission output controller according to an embodiment of the present invention. The transmission output controller is implemented by a microprocessor system including a microprocessor, a ROM, and a RAM, and the microprocessor is programmed to perform various functions of the transmission output controller according to a control program stored in the ROM. The hardware and software arrangement of the transmission output controller is well known in the art, and will not be described in detail below.

As shown in FIG. 3, the transmission output controller includes a table 31 which stores the values of a transmission output 1, a transmission output 2,, and a transmission output N. The values of the transmission outputs 1, 2,, N are successively lower by 4 dB such that the transmission output 2 is lower than the transmission output 1 by 4 dB, the transmission output 3 is lower than the transmission output 2 by 4 dB,, and the transmission output N is lower than the transmission output N-1 by 4 dB. The portable radio communication device selects one, at a time, of the values of the transmission outputs 1~N depending on the distance thereof from the central office. Specifically, if the portable radio communication device is relatively close to the central office, it selects a relatively low value of transmission output, and if the portable radio communication device is relatively distant from the central office, it selects a relatively high value of transmission output. The stored values of transmission output are selected, one at a time, by a transmission output value selector 32.

For example, if the transmission output 2 is being selected at present, then when the antenna is stored, the transmission output value selector 32 selects the transmission output 1 from the table 31. As described above, the stored condition of the antenna is determined from the stored condition signal from the detecting switch 11 shown in FIG. 2. In response to the stored condition signal supplied from the detecting switch 2 to the transmission output controller 19 shown in FIG. 2, the transmission output value selector 32 shown in FIG. 3 switches from the transmission output 2 to the transmission output 1. The transmission output value selector 32 produces a digital output signal composed of 8 bits representing the selected value of transmission output.

The transmission output controller also includes a table 33 which stores a value of 0 and an offset value that represents the difference between a transmission output produced when the antenna is extended and a transmission output produced when the antenna is stored. The offset value is usually 3–5 dB. The value of 0 and the offset value stored in the table 33 can be selected, one at a time, by an offset value selector 34. Specifically, when the antenna is extended, the offset value selector 34 selects the value of 0 from the table 33, and when the antenna is stored, the offset value selector 34 selects the offset value from the table 33. The offset value selector 34 produces a digital output signal composed of 8 bits representing the selected value.

When the antenna is stored, the tables 31, 33 may be employed singly or in combination, i.e., one of the values of transmission output may be selected from the table 31 by the transmission output value selector 32 and/or one of the values may be selected from the table 33 by the offset value selector 34.

The transmission output controller also includes a table 35 which stores an adjusted value indicative of a predetermined value of transmission output at the time the portable radio communication device is manufactured. The adjusted value which is stored in the table 35 comprises a digital value of 5 bits that is normally of about ±3 dB.

The output signal from the transmission output value selector 32, the output signal from the offset value selector 34, and the output signal from the table 35 are supplied to an adder 36, which digitally adds the supplied output signals into a digital increased transmission output control signal of 8 bits which is then supplied to the D/A converter 18 (see FIG. 2).

Figure 4:
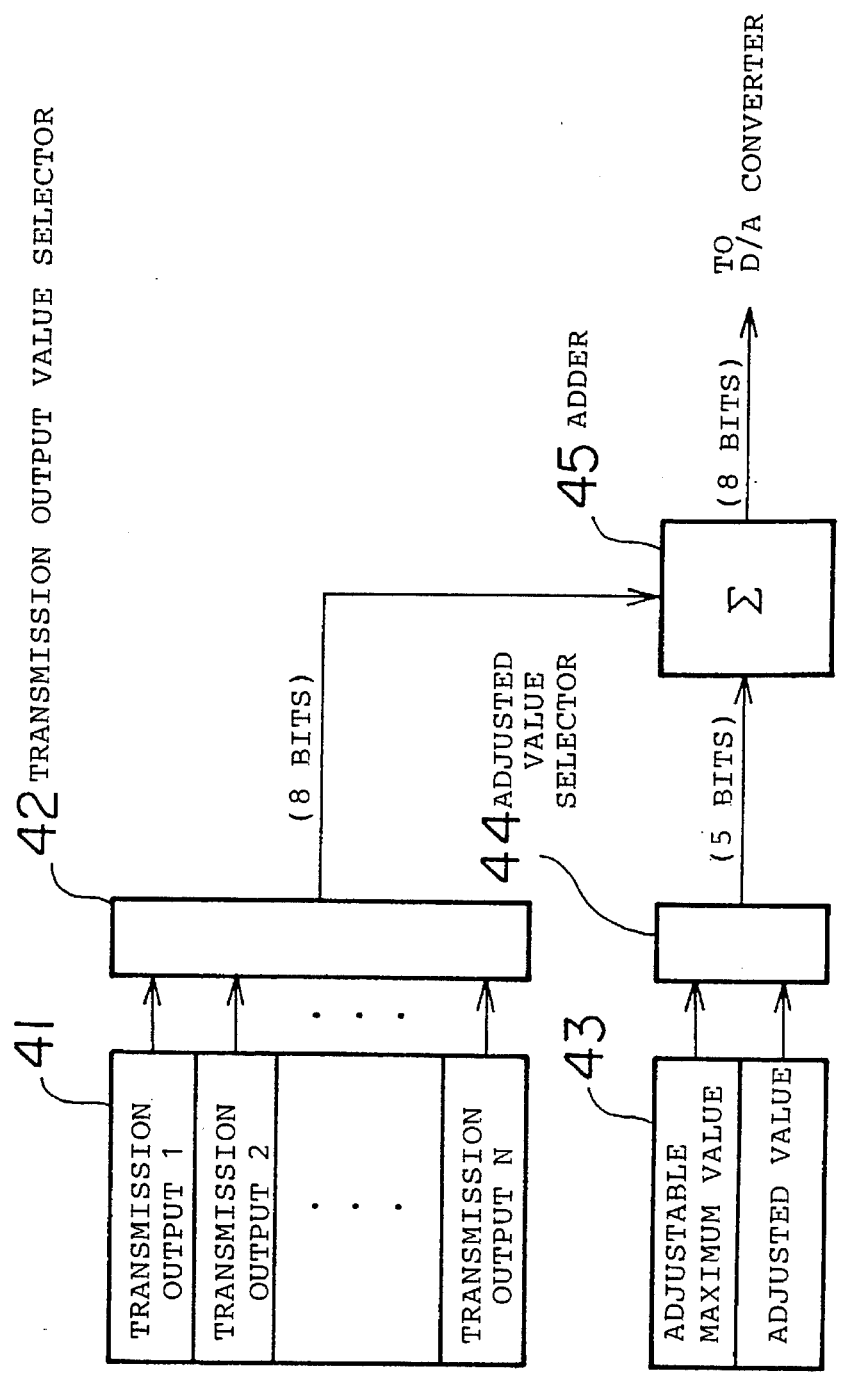
FIG. 4 is a block diagram of another transmission output controller according to the present invention.

FIG. 4 shows a transmission output controller according to another embodiment of the present invention. As shown in FIG. 4, the transmission output controller includes a table 41 which stores the values of a transmission output 1, a transmission output 2,, and a transmission output N, and a transmission output value selector 42 for selecting one, at a time, of the values stored in the table 41. The transmission output controller also includes a table 43 which stores an adjusted value entered at the time the portable radio communication device is manufactured, and an adjustable maximum value, and an adjusted value selector 44 for selecting one, at a time, of the values stored in the table 43.

When the antenna is stored, the transmission output value selector 42 selects a relatively high value of transmission output from the table 41, and produces a digital output signal of 8 bits representing the selected value of transmission output.

The adjusted value selector 44 normally selects the adjusted value. When the antenna is stored, the adjusted value selector 44 selects the adjustable maximum value. The adjustable maximum value is representative of the sum of the adjusted value and a transmission output that is to be increased when the antenna is stored. When the antenna is stored, the adjusted value selector 44 switches from the adjusted value to the adjustable maximum value, so that the antenna can transmits the signal at the same level of electric energy as when the antenna is extended. The adjusted value selector 44 produces a digital output signal of 5 bits representing the value selected from the table 43.

The output signal from the transmission output value selector 42 and the output signal from the adjusted value selector 44 are added by an adder 45 into a digital increased transmission output control signal of 8 bits which is then supplied to the D/A converter 18 (see FIG. 2).

The transmission output value selector 42 and the adjusted value selector 44 may be used singly or in combination. When they are used in combination, a relatively high value of transmission output is selected from the table 41, and the adjustable maximum value is selected from the table 43, and the signal to be transmitted may be increased by a level corresponding to the sum of the values selected from the tables 41, 43.

Figure 5:
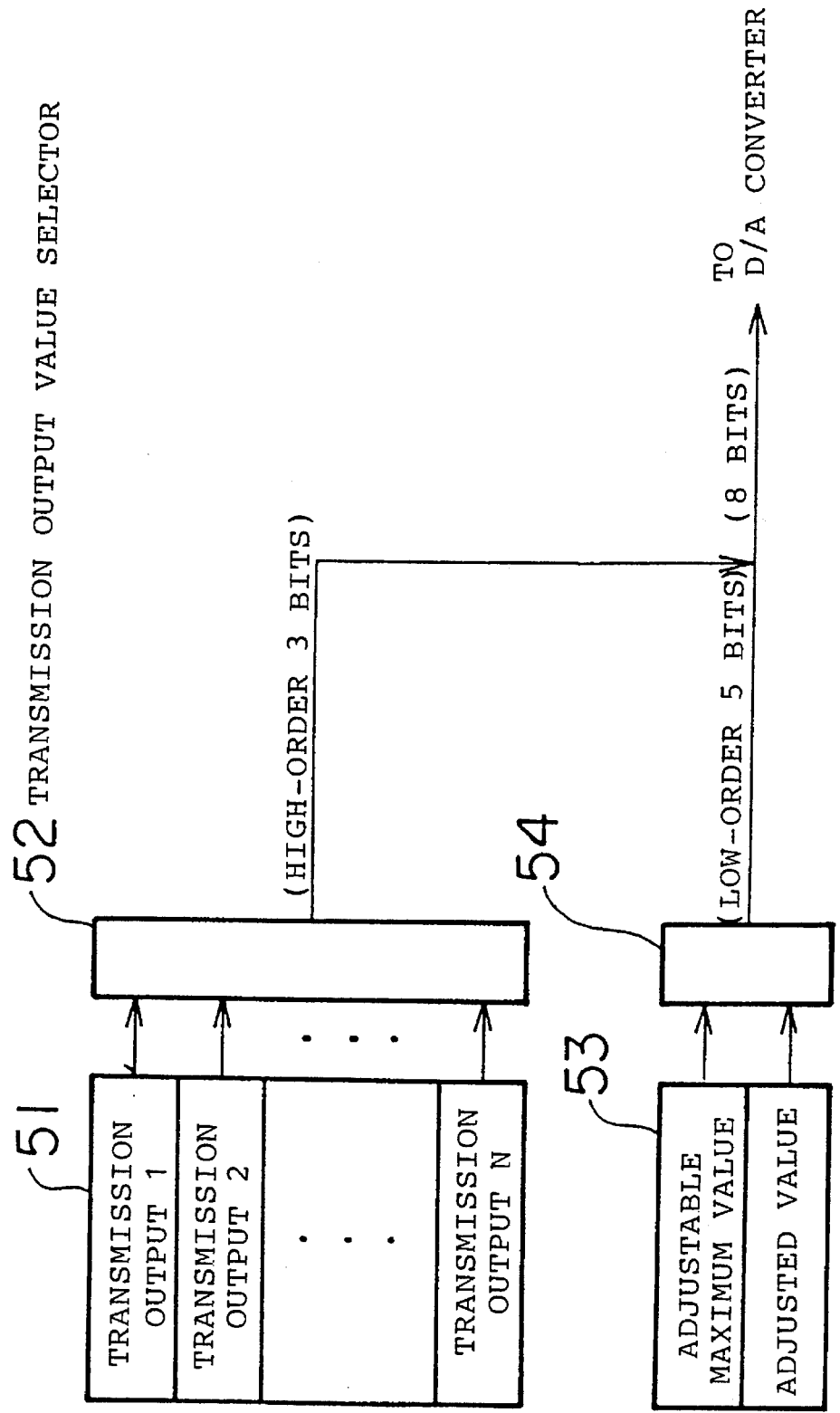
FIG. 5 is a block diagram of still another transmission output controller according to the present invention.

FIG. 5 shows a transmission output controller according to still another embodiment of the present invention. The transmission output controller shown in FIG. 5 is essentially the same as the transmission output controller shown in FIG. 4, except that a transmission output value selector 52 produces a digital output signal representing high-order 3 bits of the selected value, an adjusted value selector 54 produces a digital output signal representing low-order 5 bits of the selected value, and no adder is used. Therefore, the transmission output value selector 52 makes a rough adjustment of the transmitted signal, and the adjusted value selector 54 makes a fine adjustment of the transmitted signal when it is reduced when the antenna is stored.

In the portable radio communication device shown in FIG. 2, the detecting switch 11 comprises a mechanical switch. However, the detecting switch 11 may comprise a device for indirectly detecting when the antenna 10 is stored, e.g., a Hall-effect device.

Figure 6:
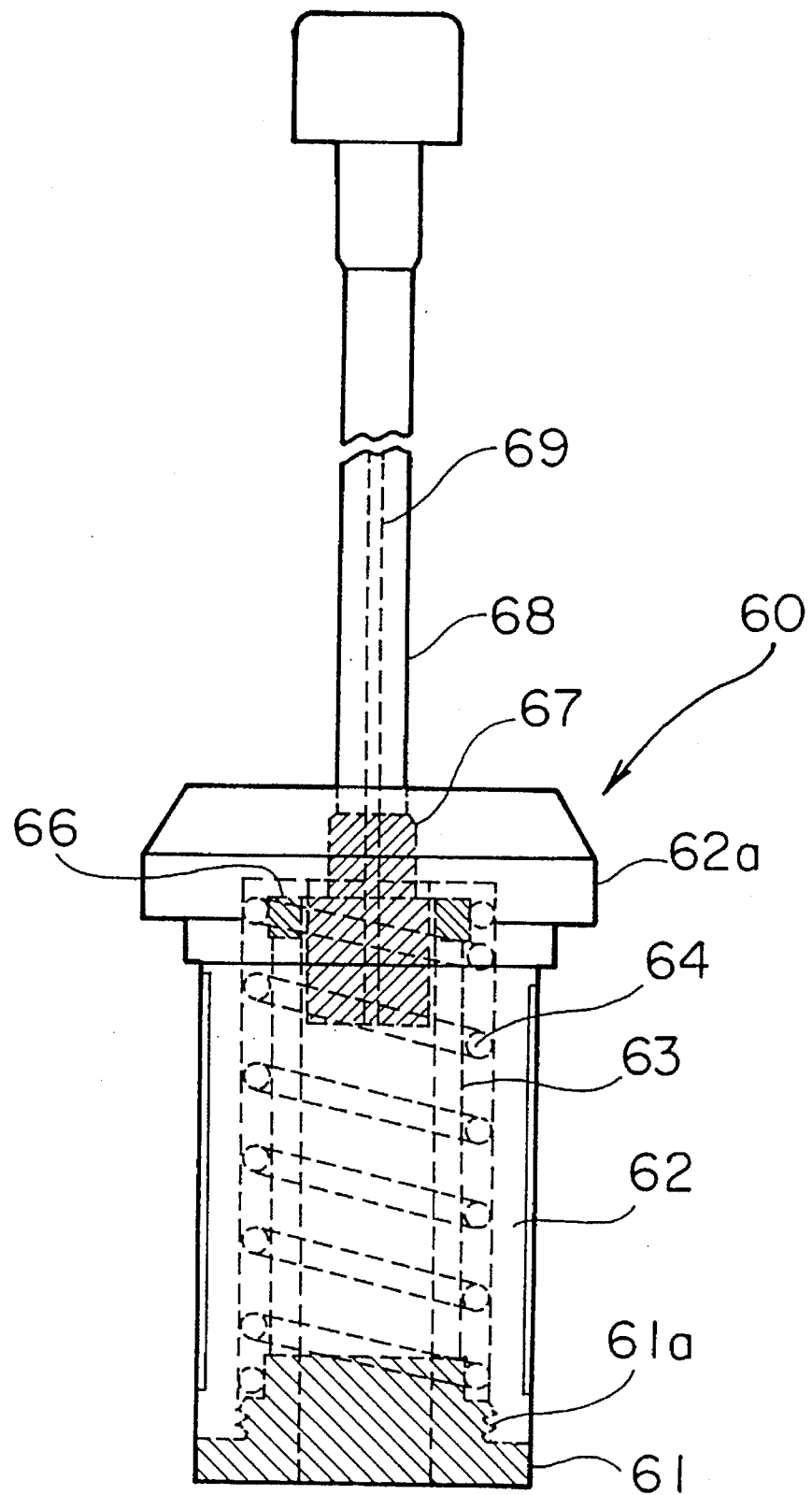
FIG. 6 is a fragmentary elevational view, partly in phantom, of a loaded antenna according to the present invention.

A loaded antenna according to the present invention, which may be used on the portable radio communication device according to the present invention, is shown in FIG. 6. In FIG. 6, the loaded antenna is shown as extended. The loaded antenna, generally designated by the reference numeral 60, has a cylindrical feeding point member 61 which has a step on its bottom serving as a feeding point for supplying an electric energy to be transmitted from the loaded antenna. The loaded antenna 60 includes a tubular casing 62 threaded over an externally threaded portion 61a of the cylindrical feeding point member 61. The casing 62 has an attachment flange 62a on its upper end which will be attached to the housing of the portable radio communication device. The casing 62 houses therein a tubular loading coil support 63 of an insulating material which is fixedly mounted on an upper end of the cylindrical feeding point member 61.

Between the tubular loading coil support 63 and casing 62, there is defined a concentric cylindrical space that accommodates a spring-like loading coil 64 disposed around the tubular loading coil support 63. The loading coil 64 has a lower end electrically connected to the cylindrical feeding point member 61. The loading coil 64 has an upper end fixedly connected to a substantially ting-shaped antenna element joint 66 which is disposed on the upper end of the tubular loading coil support 63. The antenna element joint 66 is made of an alloy of copper and nickel or the like. The antenna element joint 66 is electrically connected to the upper end of the loading coil 64.

A whip antenna feeder 67 is vertically movably disposed in the tubular loading coil support 63. The whip antenna feeder 67 comprises a stepped cylindrical member made of an alloy of copper and nickel or the like. A whip antenna 69 has a lower end fixed to the upper end of the whip antenna feeder 67, and is electrically connected thereto. The whip antenna 69 may comprise a piano wire, a rod of a shape memory alloy, or the like. The whip antenna 69 is covered with an insulating protective layer 68 molded of synthetic resin.

When the loaded antenna 60 is extended, i.e., when the whip antenna 69 is drawn upwardly, the whip antenna feeder 67 is brought into electric contact with the antenna element joint 66. As a result, the cylindrical feeding point member 61, the loading coil 64, the antenna element joint 66, the whip antenna feeder 67, and the whip antenna 69 are electrically connected to each other, whereupon the loaded antenna 60 serves as an ordinary bottom-loaded antenna.

When the loaded antenna 60 is stored, i.e., when the whip antenna 69 is retracted downwardly, the whip antenna feeder 67 is lowered out of electric contact with the antenna element joint 66 into the tubular loading coil support 63. The cylindrical feeding point member 61 is now connected to only the loading coil 64, so that the loaded antenna 60 serves as a helical antenna.

Characteristics of the loaded antenna 60 will be described below.

Figure 7:
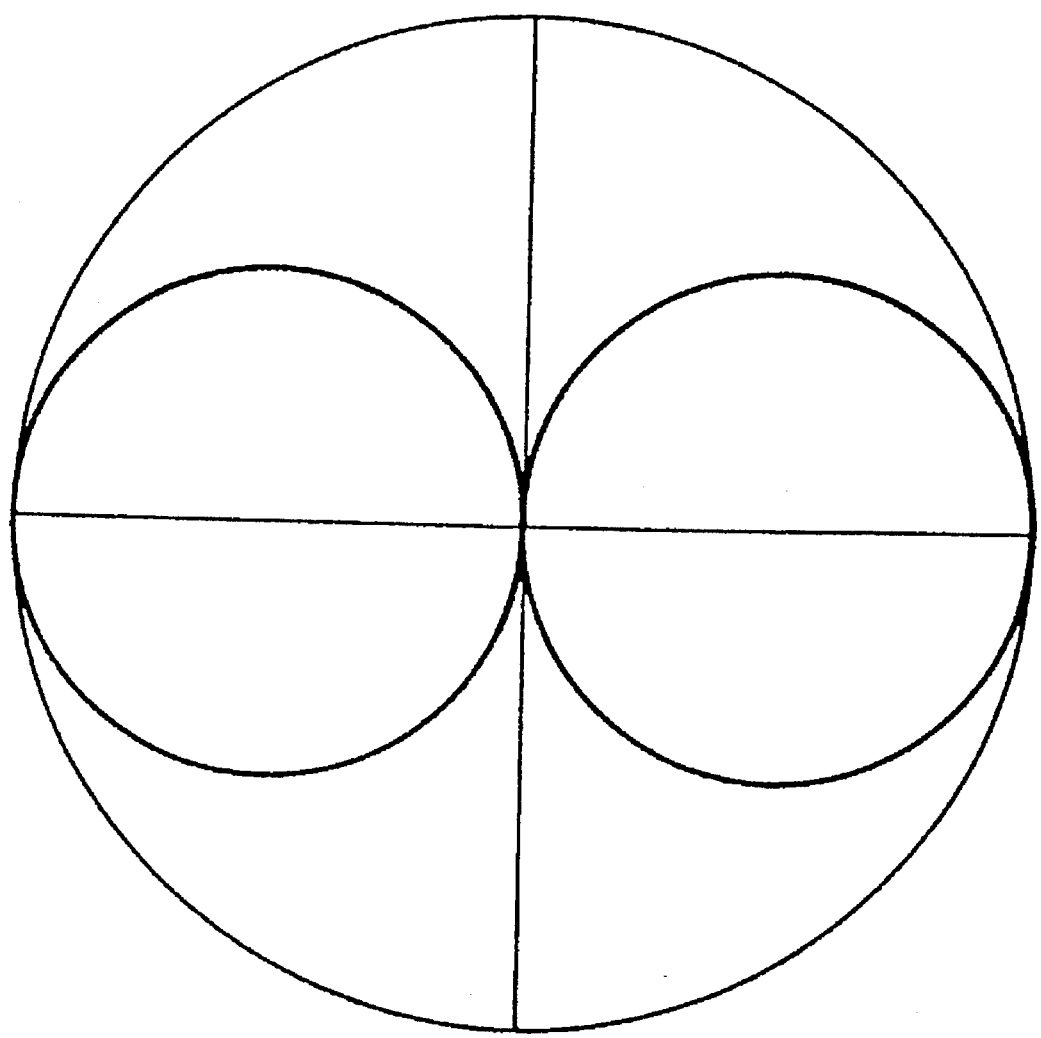
FIG. 7 is a diagram showing the directivity pattern of a dipole antenna.
Figure 8:
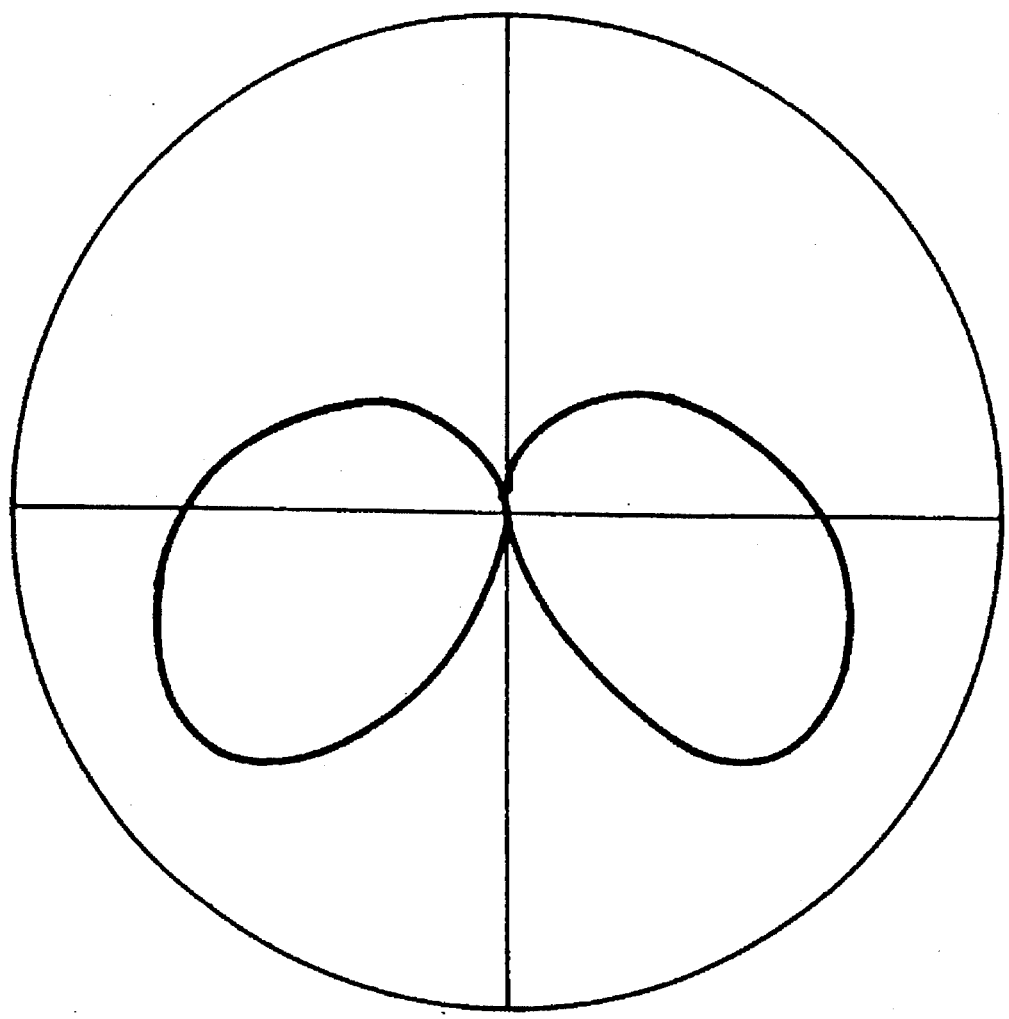
FIG. 8 is a diagram showing a downward directivity pattern.
Figure 9:
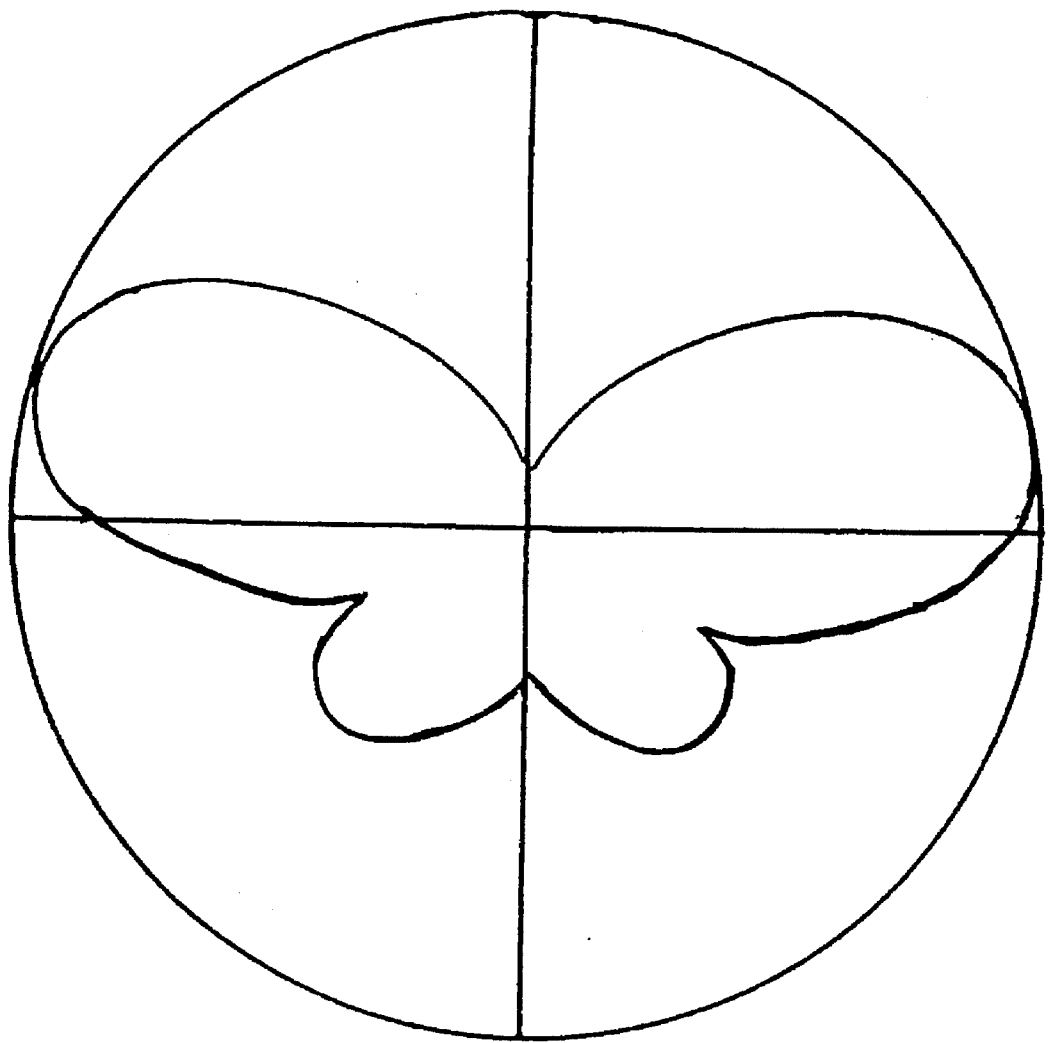
FIG. 9 is a diagram showing the directivity pattern of a helical antenna.

FIG. 7 shows the directivity pattern of a dipole antenna. The antenna of the portable radio communication device is relatively short because the portable radio communication device has a small size. Therefore, the antenna of the portable radio communication device has a downward directivity pattern as shown in FIG. 8 and a low antenna gain. FIG. 9 illustrates the directivity pattern of a helical antenna which is placed on an ideal ground plane. The directivity pattern of the helical antenna is directed upwardly as shown in FIG. 9.

When the loaded antenna 60 shown in FIG. 6 is extended, it operates as a bottom-loaded antenna, and its antenna gain and directivity pattern are not degraded though it is relatively small in size. The loaded antenna 60 as it is extended and serves as a bottom-loaded antenna has a directivity pattern which is substantially the same as the directivity pattern shown in FIG. 7. When the loaded antenna 60 is stored, it operates as a helical antenna and has a directivity pattern which is substantially the same as the directivity pattern shown in FIG. 9. At any rate, the loaded antenna 60 does not have the directivity pattern shown in FIG. 8.

Figure 10:
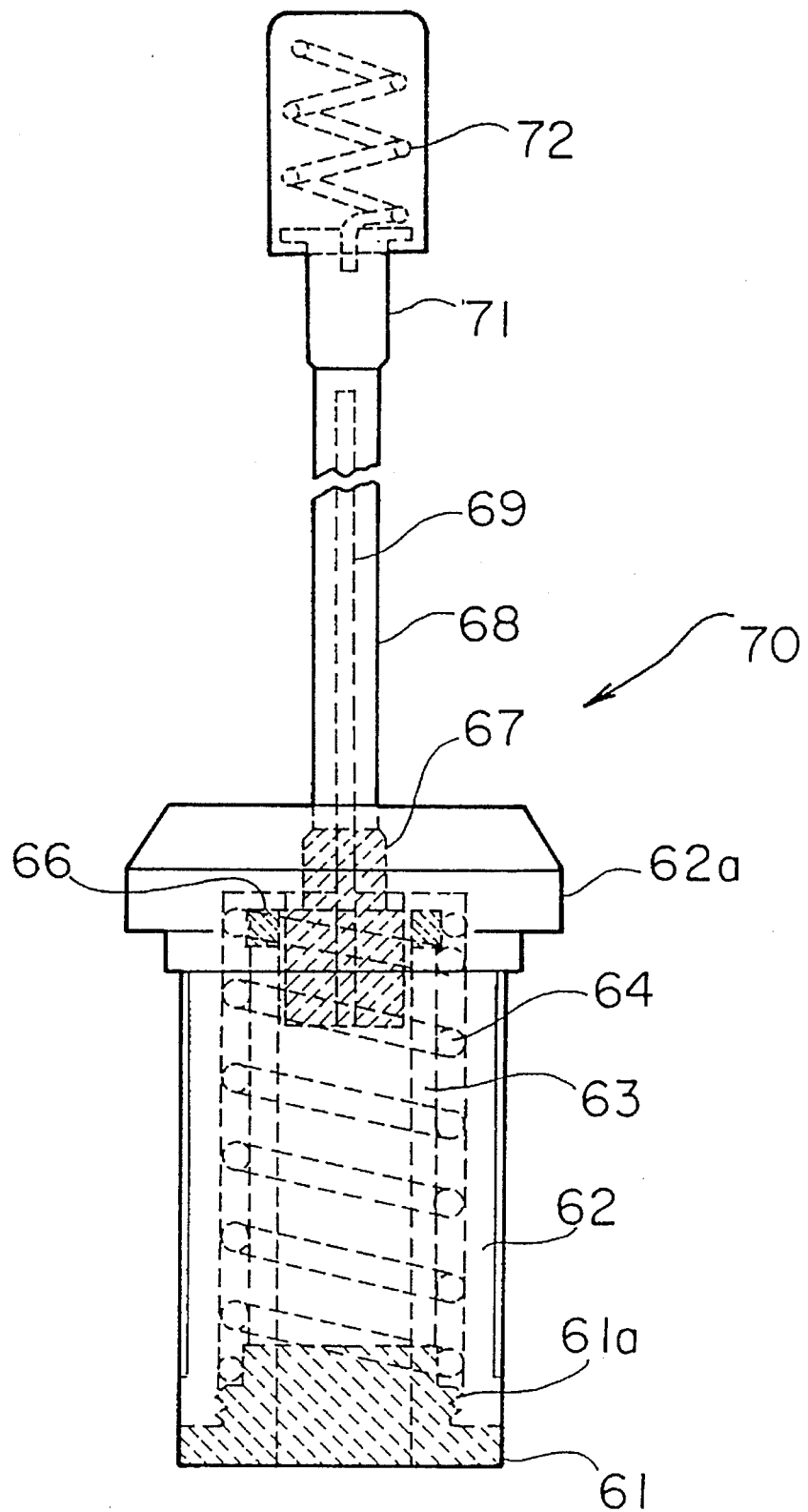
FIG. 10 is a fragmentary elevational view, partly in phantom, of another loaded antenna according to the present invention.

FIG. 10 shows another loaded antenna 70 according to the present invention, which may be used on the portable radio communication device according to the present invention. The loaded antenna 70 illustrated in FIG. 10 is basically the same as the loaded antenna 60 shown in FIG. 6. Those parts shown in FIG. 10, which are identical to those shown in FIG. 6, are denoted by identical reference numerals, and will not be described in detail below.

The loaded antenna 70 illustrated in FIG. 10 differs from the loaded antenna 60 shown in FIG. 6 in that the whip antenna 69 has a top loading coil feeder 71 and a top loading coil 72 in an upper end portion thereof. The loading coil 64 shown in FIG. 10 is referred to as a bottom loading coil 64. The top loading coil feeder 71 is positioned on the top of and electrically connected to the whip antenna 69, and the top loading coil 72 is disposed above and electrically connected to the top loading coil feeder 71.

When the loaded antenna 70 is extended, the cylindrical feeding point member 61, the loading coil 64, the antenna element joint 66, the whip antenna feeder 67, the whip antenna 69, the top loading coil feeder 71, and the top loading coil 72 are electrically connected to each other. The loaded antenna 70 now serves as an ordinary loaded antenna that is equipped with the top loading coil 72 and the bottom loading coil 64.

When the loaded antenna 70 is stored, the whip antenna feeder 67 is lowered out of electrical contact with the antenna element joint 66 into the tubular loading coil support 63, and the top loading coil feeder 71 is brought into electrical contact with the antenna element joint 66. The cylindrical feeding point member 61 is now connected to only the bottom loading coil 64, so that the loaded antenna 60 serves as a helical antenna. Therefore, the bottom loading coil 64 and the top loading coil 72 are electrically connected to the cylindrical feeding point member 61, whereupon the loaded antenna 70 serves as a helical antenna.

Consequently, the loaded antenna 70 operates as a loaded antenna when it is extended, and as a helical antenna when it is stored.

The loaded antenna 70 has antenna characteristics that are fundamentally the same as those of the loaded antenna 60 shown in FIG. 6.

The bottom loading coil 64 of the loaded antenna 70 may be smaller in size than the loading coil 64 of the loaded antenna 60.

Figure 11:
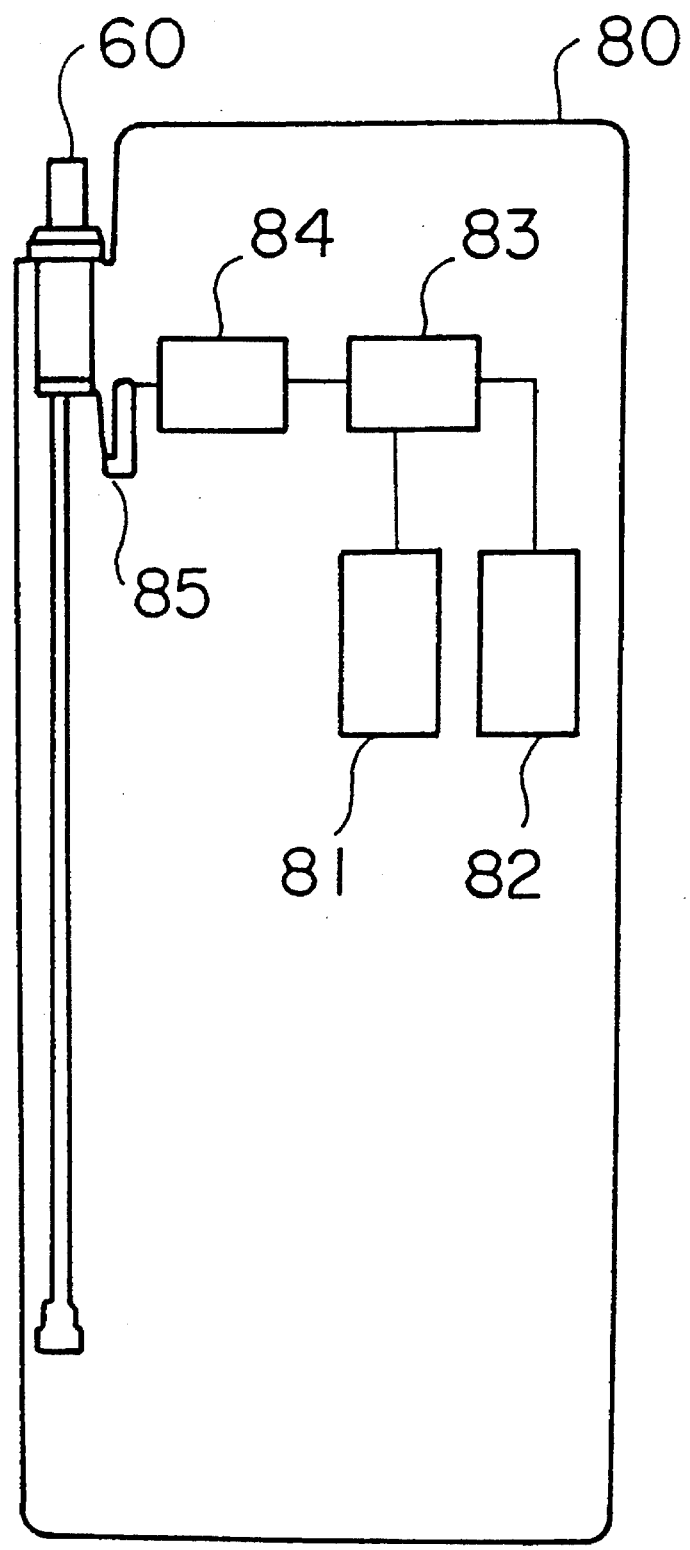
FIG. 11 is a schematic view of the loaded antenna shown in FIG. 6 as it is installed on the portable radio communication device.

FIG. 11 schematically shows the loaded antenna 60 shown in FIG. 6 as it is installed on the portable radio communication device according to the present invention.

As shown in FIG. 11, the loaded antenna 60 is installed on a housing 80 of the portable radio communication device. In the portable radio communication device, a transmitter 81 and a receiver 82 are connected to an antenna sharing unit 83, which is connected through an antenna matching circuit 84 and a antenna feeder 85 to the loaded antenna 60.

The loaded antenna 70 shown in FIG. 10 may be installed on the housing 80 and connected to the portable radio communication device as shown in FIG. 11.

Figure 12:
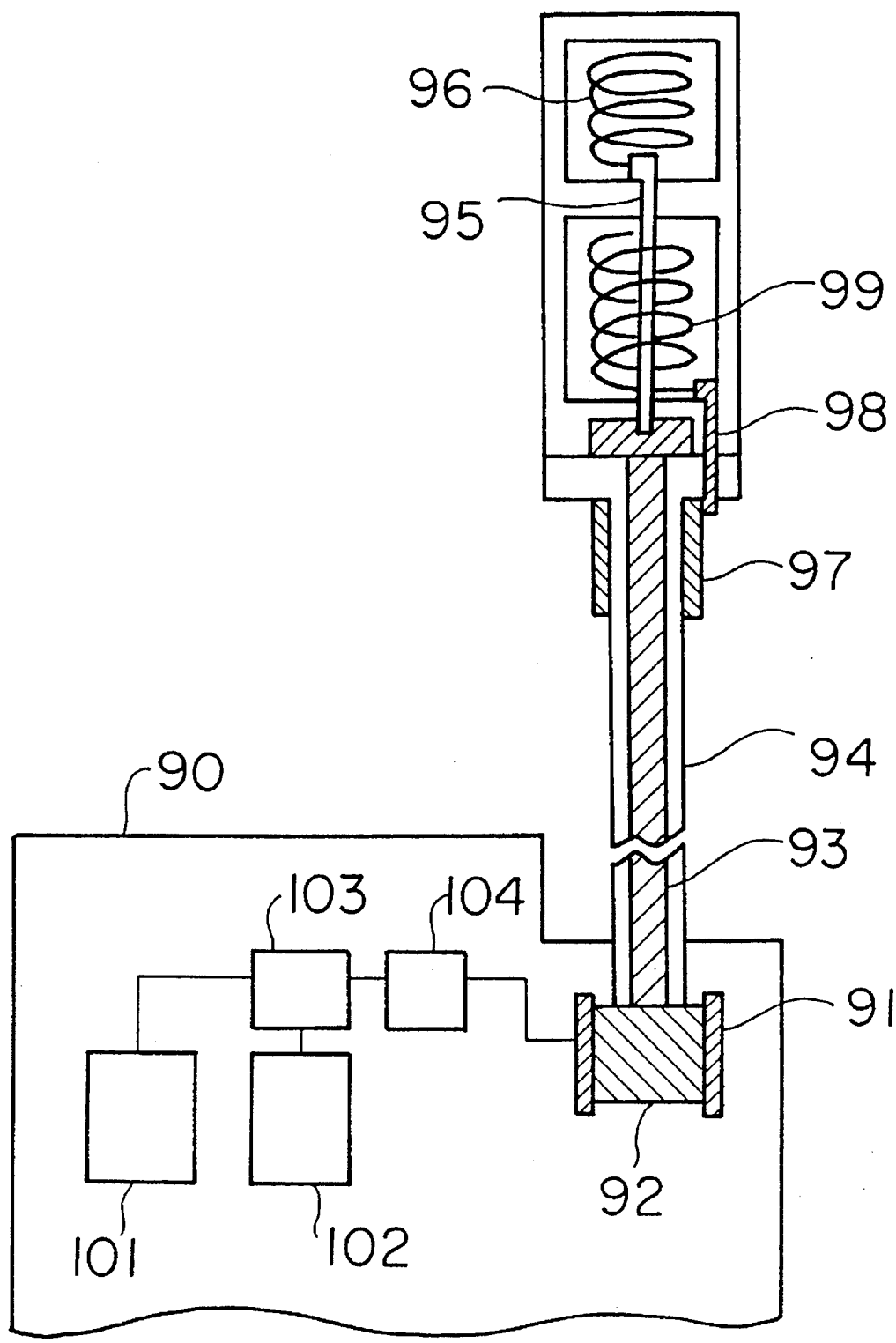
FIG. 12 is a fragmentary schematic view, partly in cross section, of still another loaded antenna according to the present invention, the loaded antenna being shown as extended.
Figure 13:
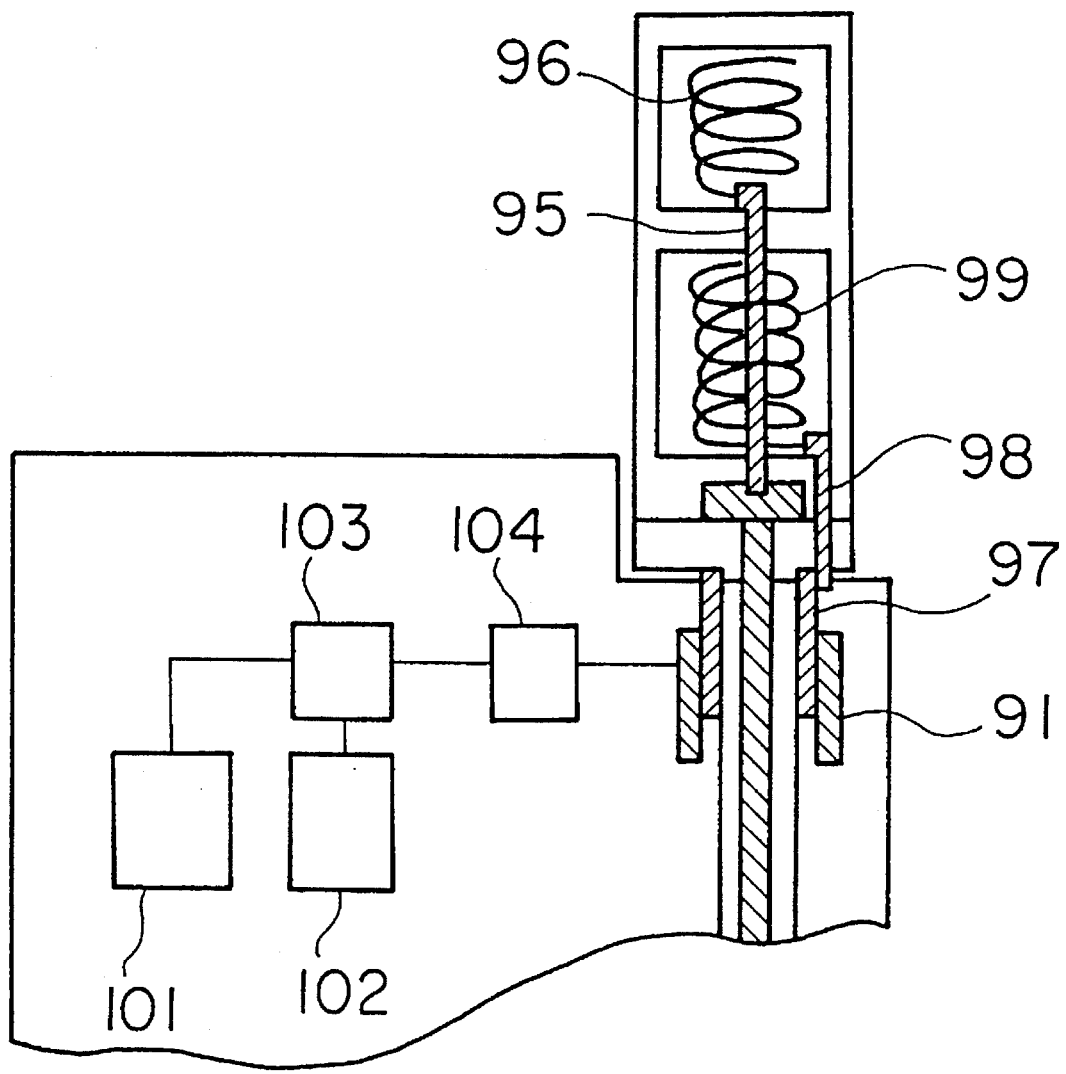
FIG. 13 is a fragmentary schematic view, partly in cross section, of the loaded antenna illustrated in FIG. 12, the loaded antenna being shown as stored.

FIGS. 12 and 13 schematically show still another loaded antenna according to the present invention as it is installed on the portable radio communication device according to the present invention. The loaded antenna being shown as extended in FIG. 12, and as stored in FIG. 13. In FIGS. 12 and 13, the portable radio communication device, designated by the reference numeral 90, has a ring-shaped feeding point member 91 disposed in a housing thereof. The loaded antenna has a whip antenna 93 connected at a lower end thereof to a cylindrical extension contact 92 and covered with a protective layer 94 molded of synthetic resin. The whip antenna 93 is vertically movable through the ring-shaped feeding point member 91. When the loaded antenna is extended as shown in FIG. 12, the cylindrical extension contact 92 is fitted into and electrically connected to the ring-shaped feeding point member 91. The whip antenna 93 has an upper end connected to the lower end of a connector 95, which has an upper end joined to an extension loading coil 96.

The portable radio communication device has a transmitter 102 and a receiver 101, which are connected to an antenna sharing unit 103 that is connected through an antenna matching circuit 104 to the ring-shaped feeding point member 91.

Therefore, when the loaded antenna is extended, the ring-shaped feeding point member 91 is electrically connected to the whip antenna 93 and the extension loading coil 96. The loaded antenna thus serves as a top-loaded antenna.

A tubular storage contact 97 is fitted over the upper end of the protective layer 94, and electrically connected through a connector 98 to a storage loading antenna 99, which is disposed around the connector 95 below the extension loading coil 96.

When the loaded antenna is stored as shown FIG. 13, the cylindrical extension contact 92 is lowered out of electric contact with the ring-shaped feeding point member 91, and the tubular storage contact 97 is lowered into electric contact with the ring-shaped feeding point member 91. As a consequence, the ring-shaped feeding point member 91 is electrically connected to only the storage loading antenna 99, whereupon the loaded antenna serves as a helical antenna.

Generally, it is ideal for the antennas, including loading coils, of portable radio communication devices to have an effective length of λ/2 when extended and an effective length of λ/4 when stored where λ is the wavelength of radio waves that are transmitted from and received by the antennas. Accordingly, the length of the whip antenna 93, the number of turns of the extension loading coil 96, and the number of turns of the storage loading coil 99 may be determined to meet the above requirements.

With the arrangement of the present invention, as described above, since the portable radio communication device increases the level of transmitted electric energy when the stored condition of the antenna is detected, the portable radio communication device can transmit desired signals at the same level of electrical energy when the antenna is stored as when the antenna is extended.

The loaded antenna according to the present invention operates as a loaded antenna when extended and as a helical antenna when stored. Thus, the loaded antenna maintains desired antenna characteristics even when it is stored.

When the loaded antenna is stored, the desired antenna characteristics can also be maintained because the loaded antenna is mechanically switchable to different loading coils when the antenna is extended and stored.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents are regarded as falling within the scope of the invention in the appended claims and their equivalents.

What is claimed is:

1. A portable radio communication device having an antenna which can be extended for use and retracted for storage, comprising:

antenna detecting means for detecting a condition in which the antenna is stored, and producing a stored condition signal representing the detected condition;

output detecting means for detecting a transmission output level which indicates a level of an output power signal to be transmitted through the antenna;

transmission output control means responsive to the stored condition signal from said antenna detecting means, for producing an increased transmission output signal which is larger than a transmission output signal in a normal operating condition in which the antenna is extended;

amplification control means responsive to said increased transmission output signal received as a reference signal, for generating an amplification control signal so that said transmission output level agrees with said reference signal; and amplification means for amplifying a transmission signal in accordance with said amplification control signal and supplying the amplified transmission signal to the antenna as said output power signal.

2. A portable radio communication device according to claim 1, wherein said transmission output control means comprises:

transmission output value selecting means for selecting a transmission output value and outputting high-order bits of the selected transmission output value;

adjusted value selecting means for selecting an adjustable maximum value, and outputting low-order bits of the selected value; and an adder for adding said high-order bits and said low-order bits into a sum signal, and outputting said sum signal as said increased transmission output control signal.

3. A portable radio communication device according to claim 2, wherein said adjusted value selecting means selects one of an adjusted value which is set to correct said transmission output value when the portable radio communication device is manufactured, and said adjustable maximum value, and outputs said low-order bits of the selected value.

4. A portable radio communication device according to claim 1, wherein said transmission output control means comprises:

transmission output value selecting means for selecting and outputting a transmission output value;

offset value selecting means for selecting and outputting an offset value to correct said transmission output value; and an adder for adding said transmission output value and said offset value into a sum signal, and outputting said sum signal as said increased transmission output control signal.

5. A portable radio communication device according to claim 4, wherein said adder further adds an adjusted value which is set to correct said transmission output value when the portable radio communication device is manufactured, to said sum signal, and outputs said sum signal as said increased transmission output control signal.

6. A portable radio communication device according to claim 4, wherein one of said transmission output value selecting means and said offset value selecting means is energizable when the antenna is stored.

7. A portable radio communication device according to claim 4, wherein both of said transmission output value selecting means and said offset value selecting means is energizable when the antenna is stored.

8. A portable radio communication device according to claim 1, wherein said transmission output control means comprises:

transmission output value selecting means for selecting and outputting a transmission output value;

adjusted value selecting means for selecting an adjustable maximum value, and outputting a selected value; and an adder for adding said transmission output value and said selected value from said adjusted value selecting means into a sum signal, and outputting said sum signal as said increased transmission output control signal.

9. A portable radio communication device according to claim 8, wherein said adjusted value selecting means selects one of an adjusted value which is set to correct said transmission output value when the portable radio communication device is manufactured, and said adjustable maximum value, and outputs said selected value.

10. A portable radio communication device according to claim 8, wherein one of said transmission output value selecting means and said adjusted value selecting means is energizable when the antenna is stored.

11. A portable radio communication device according to claim 8, wherein both of said transmission output value selecting means and said adjusted value selecting means is energizable when the antenna is stored.

12. A loaded antenna which can be extended for use and retracted for storage, for use on a portable radio communication device, comprising:

a feeding point member for supplying a signal to be transmitted;

a bottom loading coil having one end electrically connected to said feeding point member;

a whip antenna disposed for movement between an extended position in which one end of the whip antenna is electrically connected to the other end of said bottom loading coil, and a stored position in which said one end of the whip antenna is electrically disconnected from the other end of said bottom loading coil; and a top loading coil electrically connected to the other end of said whip antenna, said top loading coil being disposed for electrical connection to the other end of said bottom loading coil when said whip antenna is in said stored position and electrical disconnection from the other end of said bottom loading coil when said whip antenna is in said extended position.

13. A loaded antenna which can be extended for use and retracted for storage, for use on a portable radio communication device, comprising:

a feeding point member for supplying a signal to be transmitted;

a bottom loading coil electrically connected to said feeding point member;

a loading coil support of an insulating material, said bottom loading coil being fixedly mounted on said loading coil support;

an antenna element joint mounted on an end of said loading coil support and electrically connected to an end of said bottom loading coil;

a whip antenna disposed for movement between an extended position and a stored position;

a whip antenna feeder electrically connected to said whip antenna, said whip antenna feeder being movably disposed for electrical connection to said antenna element joint when said whip antenna is in said extended position and for electrical disconnection from said antenna element joint when said whip antenna is in said stored position;

a top loading coil feeder electrically connected to said whip antenna, said top loading coil feeder being movably disposed for electrical connection to said antenna element joint when said whip antenna is in said stored position and for electrical disconnection from said antenna element joint when said whip antenna is in said extended position; and a top loading coil electrically connected to said top loading coil feeder.

14. A loaded antenna which can be extended for use and retracted for storage, for use on a portable radio communication device, comprising:

a feeding point member for supplying a signal to be transmitted;

a whip antenna disposed for movement between an extended position in which the whip antenna is electrically connected to said feeding point member, and a stored position;

an extension loading coil electrically connected to said whip antenna; and a storage loading coil disposed for electrical connection to said feeding point member when the whip antenna is in said stored position.

15. A loaded antenna which can be extended for use and retracted for storage, for use on a portable radio communication device, comprising:

a feeding point member for supplying a signal to be transmitted;

a whip antenna disposed for movement between an extended position and a stored position;

an insulating layer coveting said whip antenna;

an extension contact electrically connected to said whip antenna, said extension contact being movably disposed for electrical connection to said feeding point member when the whip antenna is in said extended position;

an extension loading coil electrically connected to said whip antenna;

a storage contact fixedly mounted on said insulating layer, said storage contact being disposed for electrical connection to said feeding point member when the whip antenna is in said stored position; and a storage loading coil electrically connected to said storage contact.

* * * * *